US008248777B2

(12) United States Patent
Prest

(10) Patent No.: US 8,248,777 B2
(45) Date of Patent: Aug. 21, 2012

(54) VISCOELASTIC MATERIAL FOR SHOCK PROTECTION IN AN ELECTRONIC DEVICE

(75) Inventor: Christopher Prest, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 468 days.

(21) Appl. No.: 12/242,907

(22) Filed: Sep. 30, 2008

(65) Prior Publication Data

US 2009/0290294 A1  Nov. 26, 2009

Related U.S. Application Data

(60) Provisional application No. 61/128,669, filed on May 23, 2008.

(51) Int. Cl.
*G06F 1/16* (2006.01)
(52) U.S. Cl. ......... 361/679.36; 361/679.32; 361/679.34; 248/560; 248/636
(58) Field of Classification Search ............. 361/679.34, 361/679.36
See application file for complete search history.

(56) References Cited

U.S. PATENT DOCUMENTS

| | | | | | |
|---|---|---|---|---|---|
| 4,278,726 | A | * | 7/1981 | Wieme | 428/300.7 |
| 4,849,580 | A | * | 7/1989 | Reuter | 174/92 |
| 5,368,914 | A | * | 11/1994 | Barrett | 428/201 |
| 5,426,562 | A | * | 6/1995 | Morehouse et al. | 361/679.34 |
| 5,587,854 | A | * | 12/1996 | Sato et al. | 360/97.01 |
| 5,783,297 | A | * | 7/1998 | Wise et al. | 428/304.4 |
| 5,965,249 | A | * | 10/1999 | Sutton et al. | 428/304.4 |
| 6,154,360 | A | * | 11/2000 | Kaczeus et al. | 361/679.34 |
| 6,262,888 | B1 | * | 7/2001 | Siedow et al. | 361/679.34 |
| 6,324,054 | B1 | * | 11/2001 | Chee et al. | 361/679.34 |
| 6,524,692 | B1 | * | 2/2003 | Rosen | 428/298.4 |
| 6,633,481 | B2 | * | 10/2003 | Pavol | 361/679.36 |
| 6,665,192 | B2 | * | 12/2003 | Wimberger Friedl et al. | 361/752 |
| 6,809,916 | B2 | * | 10/2004 | Nakata et al. | 361/115 |
| 7,009,835 | B2 | * | 3/2006 | Desai et al. | 361/679.36 |
| 7,167,360 | B2 | * | 1/2007 | Inoue et al. | 361/679.34 |
| 7,260,885 | B2 | * | 8/2007 | Albrecht et al. | 29/603.03 |
| 7,393,575 | B2 | * | 7/2008 | Boss | 428/68 |
| 7,568,942 | B1 | * | 8/2009 | Lannon et al. | 439/521 |
| 7,643,243 | B2 | * | 1/2010 | Lee et al. | 360/97.02 |
| 7,652,892 | B2 | * | 1/2010 | Shiu et al. | 361/752 |
| 7,660,107 | B2 | * | 2/2010 | Leung | 361/679.36 |
| 7,684,183 | B2 | * | 3/2010 | Mori et al. | 361/679.36 |
| 7,855,892 | B2 | * | 12/2010 | Lin | 361/730 |
| 2002/0039858 | A1 | * | 4/2002 | Kamel et al. | 439/521 |
| 2003/0137859 | A1 | * | 7/2003 | Sugawara | 365/51 |
| 2006/0148287 | A1 | * | 7/2006 | Zahnen et al. | 439/135 |
| 2007/0008697 | A1 | * | 1/2007 | Choi et al. | 361/685 |
| 2008/0024972 | A1 | * | 1/2008 | Yamaguchi | 361/685 |
| 2008/0101008 | A1 | * | 5/2008 | Ulrich et al. | 361/685 |

* cited by examiner

*Primary Examiner* — Anthony Q Edwards
(74) *Attorney, Agent, or Firm* — Kramer Levin Naftalis & Frankel LLP

(57) ABSTRACT

This invention is directed to reducing the effect of shocks on electronic device components. The electronic device component may be surrounded by a boundary element operative to deform in response to impacts. By deforming, the boundary element may be operative to absorb energy received by the shock or impact without passing the energy on to the electronic device component. To maximize the effectiveness of the boundary element over a range of different impacts (e.g., strong, instantaneous impacts and weak impacts over time), a viscoelastic material may be used. The characteristic properties of the viscoelastic material may be selected based on expected impacts to the electronic device component.

10 Claims, 1 Drawing Sheet

VISCOELASTIC MATERIAL FOR SHOCK PROTECTION IN AN ELECTRONIC DEVICE

CROSS-REFERENCE TO RELATED APPLICATIONS

This application claims priority from U.S. Provisional Patent Application No. 61/128,669, filed May 23, 2008, which is incorporated herein by reference in its entirety.

BACKGROUND OF THE INVENTION

This invention relates to protecting electronic device components from shocks due to impacts on the electronic device housing.

Electronic devices are constructed using many different components, some of which may be fragile. For example, some electronic devices may include moving components that are particularly susceptible to damage when subject to impacts. Such components may include, for example, hard drives (e.g., rotating discs), input mechanisms (e.g., switches located inside the electronic device), or any other mechanical component operative to move within the electronic device.

To prevent damage to such components, elastic materials may be placed around the components to absorb at least a part of impacts. For example, an elastic sleeve may be placed around the periphery of an electronic device component such that the sleeve deflects upon impact, absorbing part of the energy transmitted to the electronic device component and reducing the force applied to the electronic device.

While using elastic materials (e.g., materials with low Young's modulus) may limit the strength of shock events on electronic device components, such materials are typically tailored to minimize a specific impact (e.g., a maximum drop while the component is not moving). While the material may prevent damage due to less significant impacts, if the component is subject to a lesser impact while it is more susceptible to damage, the elastic protection material may not be sufficient (e.g., the elastic material cannot reduce the force to an amount less than the critical force when the component is more susceptible). In addition, the amount of elastic material necessary to cushion an impact may be too large to be a useful approach in small form-factor electronic devices.

SUMMARY OF THE INVENTION

A system for protecting electronic device components from impacts by using a viscoelastic material is provided.

An electronic device component may be surrounded on all sides by material operative to absorb a shock to the electronic device component. The material may be distributed around the component using any suitable criteria, including for example based on analysis of the most likely impact orientations for different types of impacts (e.g., the orientation of the component when the electronic device is dropped from a low height, and the orientation of the component when the device is dropped from a larger height).

The material used to reduce shocks on the component may be selected for its viscoelastic properties. When a viscoelastic material is stressed (e.g., during an impact or shock event), the reaction and deformation of the material includes both a viscous response (e.g., the rate of deformation is related to the impact) and an elastic response (e.g., the material deforms immediately upon impact and returns to its prior configuration once the effect of the impact has dissipated). By carefully selecting the viscous and elastic properties of the material, the effect of shocks to electronic device components may be more effectively reduced for a wide variety of shocks (e.g., by maximizing the deformation of the material for a range of shock events).

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
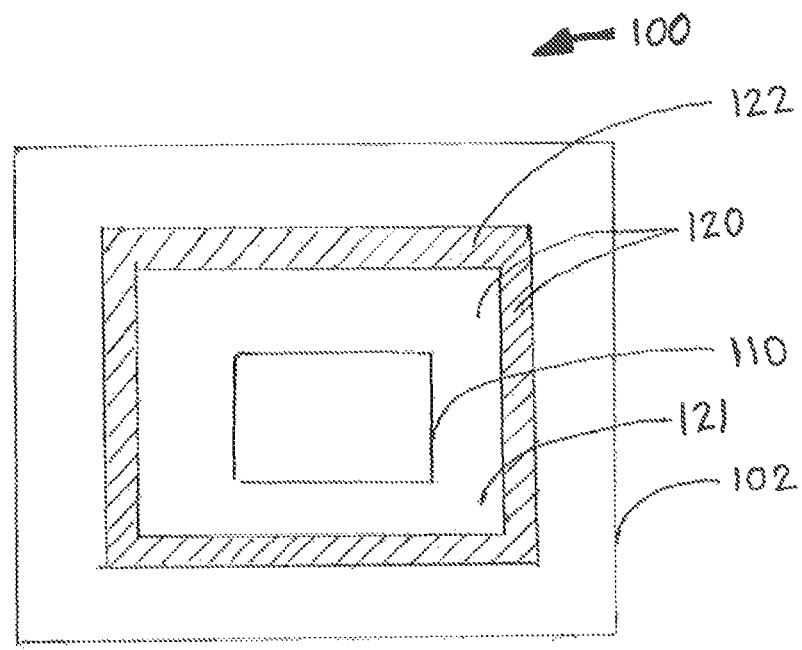
FIG. 1 is a schematic view of an electronic device component surrounded by a boundary element in accordance with one embodiment of the invention.

FIG. 1 is a schematic view of an electronic device component surrounded by a boundary element in accordance with one embodiment of the invention. Electronic device 100 may include housing 102 forming the outer cover of the device and component 110 placed inside the housing. In some embodiments, electronic device 100 may include more than one component 110, but for the sake of clarity, only one is shown in FIG. 1.

To reduce the effect of shocks on component 110, electronic device 100 may include boundary element 120 (e.g., a snubber material). Boundary element 120 may include first layer 121, located adjacent to component 110, and second layer 122, placed adjacent to the outer surface of first layer 121. Boundary element 120 may at least partially surround component 110 such that boundary element 120 creates a layer (e.g., sway space) between component 110 and housing 102. For example, boundary element 120 may include a shell into which component 110 may be placed and in which component 110 may move in at least one direction or dimension. When electronic device 100 is subject to a shock causing component 110 to be displaced toward housing 102 (or other components of electronic device 100), boundary element 120 may be operative to impact housing 102 and deform prior to component 110 reaching housing 102. By deforming, boundary element 120 may be operative to absorb energy of component 110 (e.g., kinetic energy) and lessen or eliminate the impact between component 110 and housing 102. In particular, boundary element 120 may deform to reduce the acceleration to which component 110 is subject, which in turn reduces the force to which component 110 is subject (e.g., F=ma).

Boundary element 120 may have any suitable geometry or thickness. For example, boundary element 120 may include a feature operative to deform to absorb an impact (e.g., a ridge or shell structure). Boundary element 120 may be placed over any suitable surface of component 110. For example, boundary element 120 may include a channel operative to receive the edges of component 110 such that upper, lower and side surfaces of the component are protected (e.g., a U-shaped wall placed around the periphery of component 110). The thickness of boundary element 120 may be selected based on physical or mechanical properties of the material used for boundary element 120, the geometry of boundary element 120 (e.g., boundary element 120 may include ridges or ribs operative to crush to absorb the impact), the amount and direction of the impact, or any other suitable criteria.

Any suitable material may be used for boundary element 120. In some embodiments, an elastic material may be used. For example, a material with a low Young's modulus (e.g., allowing extensive compressing for absorbing forces) may be used. When a force is applied to such a material, it may deform to absorb the energy and decrease the acceleration of a component placed in contact with the material. The lower the Young's modulus (e.g., the more elastic or spring-like) the material, however, the more material may be needed to deform to absorb the force. This may in turn require larger spaces to absorb force, and increase the size of the electronic device housing.

In some embodiments, a material that exhibits both elastic and viscous properties may be used. One type of material that exhibits both elastic and viscous properties is a viscoelastic material. These materials may be characterized by a time-dependent relationship between stress and strain (e.g., the amount of deformation changes over time for a constant stress). The viscoelastic material may have any suitable relation between stress and strain rate. For example, if stress is linearly proportional to the stress rate, the material may be characterized as a linear or Newtonian material. As another example, if stress is not linearly proportional to the stress rate, the material may be characterized as a non-linear or non-Newtonian material.

The response of viscoelastic materials may be predicted or calculated using a number of different approaches. For example, for linear viscoelastic materials, strain can be written as the sum of a stress component (e.g., due to a received force) and a creep component (e.g., due to re-arranging of molecules in the material). Other suitable approaches for modeling linear viscoelastic materials may include, for example, the Maxwell model, the Kelvin-Voigt model, the Standard Linear Sold model, or the Generalized Maxwell model. As another example, non-linear viscoelastic materials may be characterized by a complex dynamic modulus representing the relation between the oscillating stress and strain.

Using a viscoelastic material for damping may provide protection for an electronic device component from different types of impacts. For example, the coefficients of the viscoelastic material may be selected such that the strain is maximized for several types of impacts. In one such approach, the material may be selected such that the strain is large (e.g., the material deforms significantly, thus absorbing a large amount of energy) for a large impact (e.g. a drop of one meter), while the damping is substantial for a smaller impact that lasts longer (e.g., the user roughly places or pushes the electronic device on a hard surface, for example when synching the electronic device with a host device). This may be possible by selecting a material for which the elastic properties are dominant in the large impact scenario (e.g., a large force applied instantaneously to the material), while the viscous properties are dominant in the small impact scenario (e.g., a smaller force, applied over a period of time). When intermediate forces are applied to the material, both the elastic and viscous responses (e.g., elastic deformation and damping of the material) may enable the material to absorb the impact and reduce the shock to the component.

The stiffness or coefficients of a viscoelastic material may be selected based on a number of criteria. For example, given limited space available for a boundary element (e.g., boundary element 120), the stiffness of the material used (e.g., the relation between stress and strain rate) may be selected and tailored to optimize the force absorbed (e.g., the amount by which acceleration is reduced) for a particular impact event (e.g., a drop from a particular height). Because the viscoelastic material may include a non-linear relation between stress and strain rate, the stiffness of the material may further be tailored to provide optimized impact protection at other impact levels. For example, a non-linear viscoelastic material may be tailored to provide optimized protection for drops from 1.5 meters (e.g., a user's hand during use), 1 meter (e.g., from a table), and 0.5 meters (e.g., when a user accidentally drops and catches the device).

Figure 2:
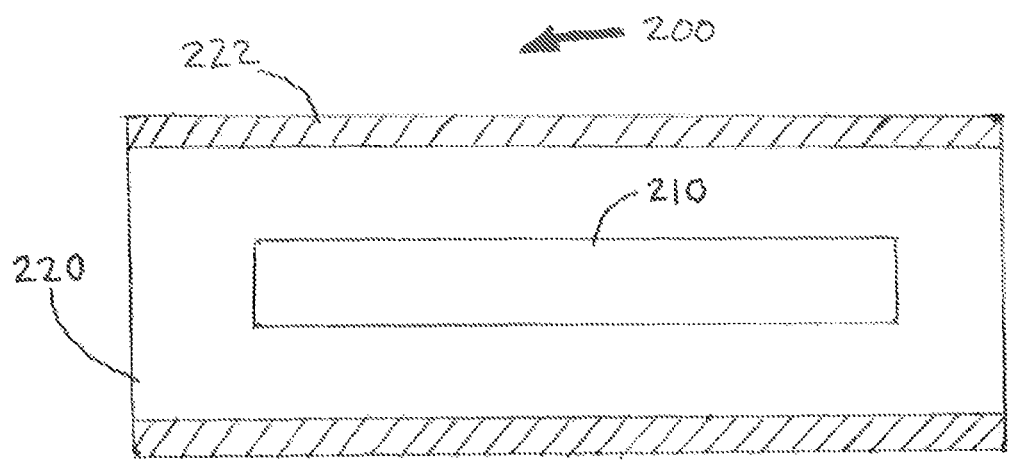
FIG. 2 is a cross-section of an illustrative boundary element in accordance with one embodiment of the invention.

Any suitable viscoelastic material may be used for boundary element 120. For example, amorphous polymers, semicrystalline polymers, biopolymers, bitumen material, or any other suitable viscoelastic material may be used. In some embodiments, the viscoelastic material may be one or more of these, and specifically tailored to maximize the reduction of impacts on the electronic device component. For example, boundary element 120 may include a combination of viscoelastic or non-viscoelastic materials. FIG. 2 is a cross-section of an illustrative boundary element in accordance with one embodiment of the invention. Boundary element 200 may be coupled to the periphery of electronic device component 210. Boundary element 200 may include several layers formed by different materials. For example, boundary element 200 may include first layer 220, located adjacent to component 210, and second layer 222, placed adjacent to the outer surface of first layer 210. Second layer 220 may be placed over any suitable surface of first layer 210, including for example over a top, bottom or side surface, or combinations of these. In some embodiments, several different materials may be placed over different surfaces of first layer 210 to provide different levels of shock absorption (e.g., based on the geometry of the component or of the device, or on expected impact patterns). The materials used in boundary element 210 may include elastic, plastic or viscoelastic materials, or combinations of these.

The above described embodiments of the present invention are presented for purposes of illustration and not of limitation, and the present invention is limited only by the following claims.

What is claimed is:

1. A method for reducing shocks received by an electronic device component, comprising:

providing the electronic device component within an electronic device housing; and defining a shell surrounding the electronic device component, the shell being fully contained within the electronic device housing, the shell comprising:

a first layer enclosing at least in part the electronic device component, the first layer located adjacent to the electronic device component and constructed from a visco-elastic material that provides shock protection of a first characteristic for the component, the first characteristic including both viscous and elastic responses; and a second layer completely enclosing the first layer, the second layer directly interfaces with the first layer and constructed from an elastic material that provides shock protection of a second characteristic for the component, the second characteristic including an elastic response;

wherein the combination of the first and second layers reduces the effects of shock events of varying magnitudes to the component.

2. The method of claim 1, wherein the electronic device component is operative to move in at least one direction within the shell.

3. The method of claim 1, further comprising:

determining the impact for which protection of the component is to be optimized; and selecting a viscoelastic material for which strain rate is less than a maximum value for the stress associated with the determined impact.

4. The method of claim 3, wherein the viscoelastic material is operative to deform in response to a force being applied to the electronic device.

5. An electronic device with shock protection for components, comprising:

a housing;

at least one component placed within the housing, the at least one component operative to deflect in response to a force being applied to the housing; and a boundary component placed around at least a portion of the at least one component, the boundary component comprising:

a first layer enclosing at least in part the at least one component, the first layer located adjacent to the electronic device component and constructed from a visco-elastic material that provides shock protection of a first characteristic for the component, the first characteristic including both viscous and elastic responses; and a second layer completely enclosing the first layer, the second layer directly interfaces with the first layer and constructed from an elastic material that provides shock protection of a second characteristic for the component, the second characteristic including an elastic response;

wherein the combination of the first and second layers reduces the effects of shock events of varying magnitudes to the component.

6. The electronic device of claim 5, wherein the boundary component is positioned adjacent to the at least one component.

7. The electronic device of claim 6, wherein the boundary component is positioned such that the at least one component is operative to deflect into the boundary component in response to the force being applied to the housing.

8. The electronic device of claim 5, wherein the boundary component is at least one of an amorphous polymer, a semi-crystalline polymer, a biopolymer, and bitumen material.

9. The electronic device of claim 5, wherein the relationship between stress and strain rate of the boundary component is optimized for at least two different levels of forces applied to the housing.

10. The electronic device of claim 9, wherein the relationship between stress and strain rate of the boundary component is non-linear.

* * * * *